(12) United States Patent
Lin et al.

(10) Patent No.: US 8,963,299 B2
(45) Date of Patent: Feb. 24, 2015

(54) SEMICONDUCTOR PACKAGE AND FABRICATION METHOD THEREOF

(71) Applicant: Siliconware Precision Industries Co., Ltd., Taichung Hsien (TW)

(72) Inventors: Chien-Cheng Lin, Taichung Hsien (TW); Tsung-Hsien Hsu, Taichung Hsien (TW); Heng-Cheng Chu, Taichung Hsien (TW); Chao-Ya Yang, Taichung Hsien (TW); Chih-Ming Cheng, Taichung Hsien (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 28 days.

(21) Appl. No.: 13/660,277

(22) Filed: Oct. 25, 2012

(65) Prior Publication Data
US 2013/0320513 A1   Dec. 5, 2013

(30) Foreign Application Priority Data

Jun. 4, 2012  (TW) ............................. 101119915 A
Sep. 19, 2012  (TW) ............................. 101134232 A

(51) Int. Cl.
*H01L 23/552*   (2006.01)
*H01L 21/00*   (2006.01)

(52) U.S. Cl.
USPC ............................. 257/659; 438/121; 438/107

(58) Field of Classification Search
CPC ................. H01L 23/552; H01L 21/56; H01L 2225/06537; H01L 2924/3025
USPC ................................... 257/659; 438/107, 121
See application file for complete search history.

(56) References Cited

U.S. PATENT DOCUMENTS

| | | | |
|---|---|---|---|
| 6,737,750 B1 * | 5/2004 | Hoffman et al. | 257/777 |
| 7,049,682 B1 | 5/2006 | Mathews et al. | |
| 7,701,040 B2 * | 4/2010 | Huang et al. | 257/659 |
| 8,049,119 B2 | 11/2011 | Beddingfield et al. | |
| 2001/0033478 A1 * | 10/2001 | Ortiz et al. | 361/818 |
| 2002/0129951 A1 * | 9/2002 | Babb et al. | 174/35 R |
| 2004/0183180 A1 * | 9/2004 | Chung et al. | 257/686 |
| 2004/0195591 A1 * | 10/2004 | Gehman et al. | 257/202 |
| 2004/0231872 A1 * | 11/2004 | Arnold et al. | 174/35 R |
| 2004/0238934 A1 * | 12/2004 | Warner et al. | 257/686 |
| 2008/0315374 A1 * | 12/2008 | Kim et al. | 257/659 |
| 2010/0164076 A1 * | 7/2010 | Lee et al. | 257/659 |
| 2010/0207258 A1 * | 8/2010 | Eun et al. | 257/660 |
| 2010/0207259 A1 * | 8/2010 | Liao et al. | 257/660 |
| 2011/0186943 A1 * | 8/2011 | Pahl et al. | 257/416 |
| 2011/0298105 A1 * | 12/2011 | Chi et al. | 257/659 |
| 2012/0086109 A1 * | 4/2012 | Kim et al. | 257/659 |
| 2012/0119346 A1 * | 5/2012 | Im et al. | 257/690 |

* cited by examiner

*Primary Examiner* — Karen Kusumakar
(74) *Attorney, Agent, or Firm* — Mintz Levin Cohn Ferris Glovsky and Popeo, P.C.; Peter F. Corless; Steven M. Jensen

(57) ABSTRACT

A semiconductor package is provided, including: a substrate having at least a conductive pad; a semiconductor element disposed on the substrate; a conductive adhesive formed on top and side surfaces of the semiconductor element and extending to the conductive pad; and an electronic element disposed on the conductive adhesive. The conductive adhesive and the conductive pad form a shielding structure so as to prevent electromagnetic interference from occurring between the semiconductor element and the electronic element.

22 Claims, 3 Drawing Sheets

SEMICONDUCTOR PACKAGE AND FABRICATION METHOD THEREOF

CROSS-REFERENCES TO RELATED APPLICATIONS

This application claims under 35 U.S.C. §119(a) the benefit of Taiwanese Application Nos. 101119915, filed Jun. 4, 2012, and 101134232, filed Sept. 19, 2012, the entire contents of which are incorporated herein by reference.

BACKGROUND OF THE INVENTION

1. Field of the Invention

The present invention relates to semiconductor packages and fabrication methods thereof, and, more particularly, to a semiconductor package having an electromagnetic interference (EMI) shielding function and a fabrication method thereof.

2. Description of Related Art

Along with the miniaturization and system integration of electronic products, various electronic elements such as one or more chips and passive components are integrated in a package to form a system in package (SIP). However, electromagnetic interferences can easily occur between adjacent electronic elements. Particularly, when more and more electronic elements are integrated in a package and arranged closer and closer to one another, the EMI problem has become more and more serious.

FIG. 1A shows a semiconductor package 1a as disclosed by U.S. Pat. No. 7,049,682. A plurality of electronic elements 11a and 14a are disposed on a substrate 10a in a side by side manner and electrically connected to the substrate 10a. Then, an encapsulant 15a is formed on the substrate 10a to encapsulate each of the electronic elements 11a and 14a, thus forming a plurality of packages 12a. Further, a plurality of lid members 13a are provided to cover the semiconductor packages 12a, respectively, so as to prevent EMI from occurring between the electronic elements 11a and 14a.

However, since the electronic elements 11a and 14a are arranged in a side by side manner, when the number of the electronic elements 11a and 14a increases, the area of the substrate 20 must be increased correspondingly in order to accommodate the electronic elements 11a and 14a, thus increasing the fabrication cost and the size of the overall structure.

Further, the use of the lid members 13a also increases the fabrication cost.

To overcome the above-described drawbacks, electronic elements can be vertically stacked on one another to thereby save space on the substrate. FIG. 1B shows a semiconductor package 1b as disclosed by U.S. Pat. No. 8,049,119. A substrate 10b having a first shielding layer 100 therein is provided, and a chip 11b is bonded to the substrate 10b in a flip-chip manner. Further, an electronic element 14b having a second shielding layer 140 formed on a bottom surface thereof via a sputtering process is stacked on the chip 11b, and the first and second shielding layers 100 and 140 are electrically connected through a conductive adhesive 13b to thereby prevent EMI from occurring between the chip 11b and an external electronic device. Then, an encapsulant 15b is formed via a molding process to encapsulate the electronic element 14b, and an opening 150 is formed in the encapsulant 15b to expose a portion of the surface of the electronic element 14b for another electronic element to be disposed thereon.

However, the sputtering process for forming the second shielding layer 140 involves a high fabrication cost.

In addition, a mold used in the molding process must be designed according to the size of the opening 150, and hence the same mold cannot be applied to electronic elements 14b of different sizes. As such, the fabrication cost is greatly increased.

Therefore, there is a need to provide a semiconductor package and a fabrication method thereof so as to overcome the above-described drawbacks.

SUMMARY OF THE INVENTION

In view of the above-described drawbacks, the present invention provides a semiconductor package, which comprises: a substrate having a plurality of first conductive pads and at least a second conductive pad; at least a semiconductor element disposed on the substrate and electrically connected to the first conductive pads; and a conductive adhesive formed on the semiconductor element and extending to the second conductive pad of the substrate so as to form a shielding structure together with the second conductive pad.

In the above-described semiconductor package, the conductive adhesive can extend to the second conductive pad along a side surface of the semiconductor element.

The present invention further provides a fabrication method of a semiconductor package, which comprises the steps of: providing a substrate having a plurality of first conductive pads and at least a second conductive pad; disposing at least a semiconductor element on the substrate and electrically connecting the semiconductor element and the first conductive pads; and forming a conductive adhesive on the semiconductor element to cover the semiconductor element, the conductive adhesive extending to the second conductive pad of the substrate so as to form a shielding structure together with the second conductive pad.

In the above-described method, the conductive adhesive can be formed by dispensing, screen printing, transfer printing or film lamination.

In the above-described semiconductor package and fabrication method thereof, at least a conductive via can be formed in the substrate and electrically connected to the second conductive pad. The conductive via can be a ground via.

In the above-described semiconductor package and fabrication method thereof, the second conductive pad can be a ground pad.

In the above-described semiconductor package and fabrication method thereof, the semiconductor element can be electrically connected to the first conductive pads through a plurality of conductive bumps. Further, an underfill can be formed between the semiconductor element and the substrate and encapsulate the conductive bumps.

In the above-described semiconductor package and fabrication method thereof, at least an electronic element can be disposed on the conductive adhesive and the substrate further has a plurality of third conductive pads electrically connected to the electronic element. The electronic element can be a package or a chip. Further, an encapsulant can be formed on the substrate and encapsulate the semiconductor element, the electronic element and the conductive adhesive.

In the above-described semiconductor package and fabrication method thereof, an underfill can be formed between the semiconductor element and the substrate so as for the conductive adhesive to be formed on the underfill.

Therefore, by forming the conductive adhesive between the semiconductor element and the electronic element and connecting the conductive adhesive to the second conductive pad so as to achieve a preferred grounding effect, the present invention prevents electromagnetic interference from occurring between the semiconductor element and the electronic element.

Further, the conductive adhesive can be conveniently formed without the need to perform a sputtering process or fabricate a lid member as did in the prior art, thus effectively reducing the fabrication cost.

Furthermore, since no opening is formed in the encapsulant, the present invention simplifies the design of a mold used in a molding process and allows the same mold to be applicable to electronic elements of various sizes, thus resulting in a reduced fabrication cost.

DETAILED DESCRIPTION OF PREFERRED EMBODIMENTS

The following illustrative embodiments are provided to illustrate the disclosure of the present invention, these and other advantages and effects can be apparent to those in the art after reading this specification.

It should be noted that all the drawings are not intended to limit the present invention. Various modification and variations can be made without departing from the spirit of the present invention. Further, terms such as "upper", "side", "first", "second", "third", "a" etc. are merely for illustrative purpose and should not be construed to limit the scope of the present invention.

Figure 1A:
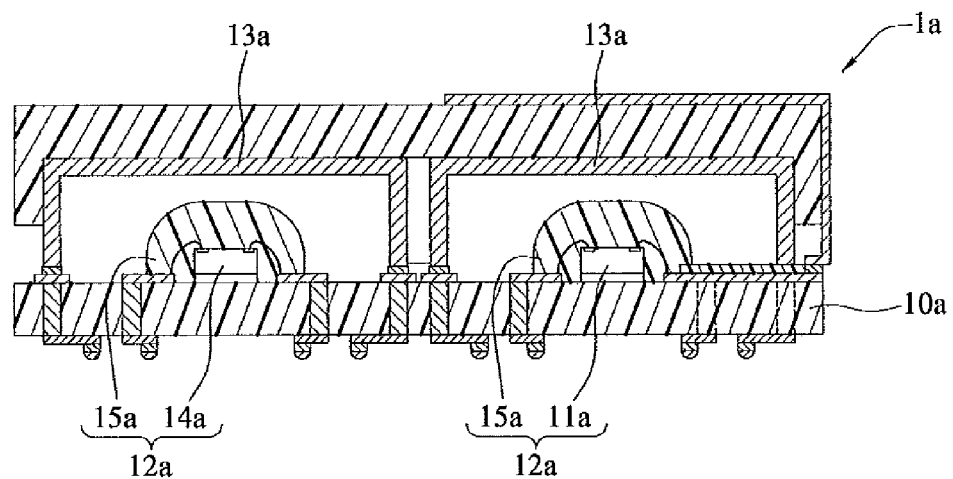
FIG. 1A is a schematic cross-sectional view showing a semiconductor package as disclosed by U.S. Pat. No. 7,049, 682.
Figure 1B:
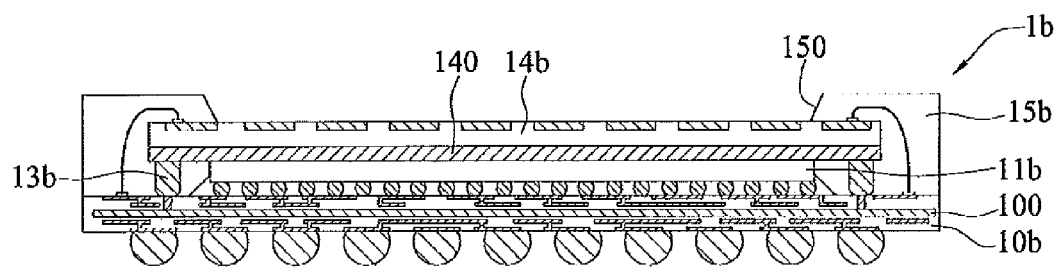
FIG. 1B is a schematic cross-sectional view showing a semiconductor package as disclosed by U.S. Pat. No. 8,049, 119.
Figure 2A:
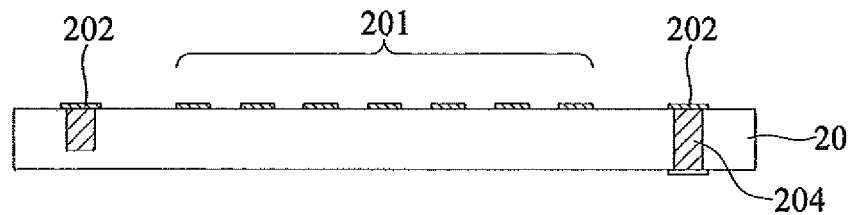
FIGS. 2A to 2C are schematic cross-sectional views showing a fabrication method of a semiconductor package of an embodiment according to the present invention.
Figure 2B:
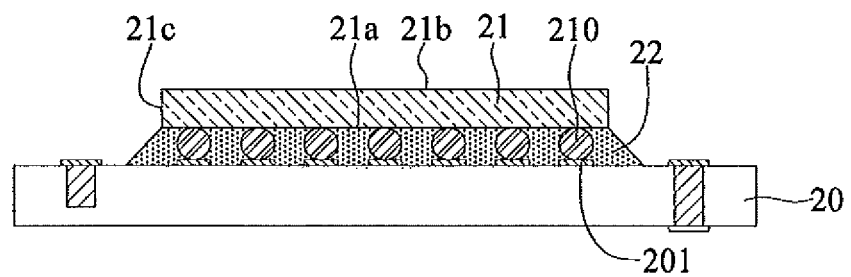
Figure 2C:
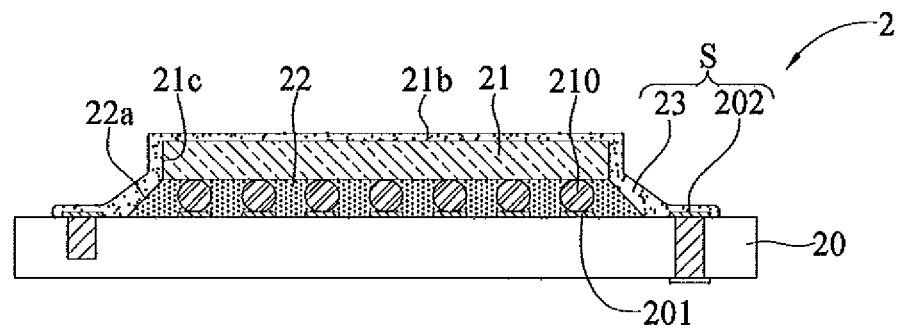

FIGS. 2A to 2C are schematic cross-sectional views showing a fabrication method of a semiconductor package 2 according to the present invention.

Referring to FIG. 2A, a substrate 20 is provided, including a plurality of first conductive pads 201, a plurality of second conductive pads 202 and a plurality of conductive vias 204. The conductive vias 204 are electrically connected to the second conductive pads 202.

In an embodiment, the second conductive pads 202 are ground pads, and the conductive vias 204 are ground vias.

In other embodiments, only one second conductive pad 202 is formed according to the practical requirement.

In addition, conductive vias or circuits (not shown) having other functions can be formed in the substrate 20.

But it should be noted that the present invention is not limited to the above-described structure. Instead, the substrate 20 can have various structures.

Referring to FIG. 2B, a semiconductor element 21 is disposed on the substrate 20 and electrically connected to the first conductive pads 201 through a plurality of conductive bumps 210.

Then, an underfill 22 is formed between the semiconductor element 21 and the substrate 20 for encapsulating the conductive bumps 210.

In an embodiment, the semiconductor element 21 is a semiconductor chip. The semiconductor element 21 has an active surface 21a, an non-active surface 21b opposite to the active surface 21a, and side surfaces 21c, and the active surface 21a is bonded to the conductive bumps 210 so as for the semiconductor element 21 to be attached to the substrate 20.

Referring to FIG. 2C, a conductive adhesive 23 is formed on the non-active surface 21b and the side surfaces 21c of the semiconductor element 21 so as to cover the semiconductor element 21. Further, the conductive adhesive 23 extends from the side surfaces 21c of the semiconductor element 21 to the second conductive pads 202 of the substrate 20 along side surfaces 22a of the underfill 22. As such, the conductive adhesive 23 and the second conductive pads 202 form a shielding structure S.

In an embodiment, the conductive adhesive 23 can be formed by dispensing, screen printing, transfer printing or film lamination.

Figure 2D:
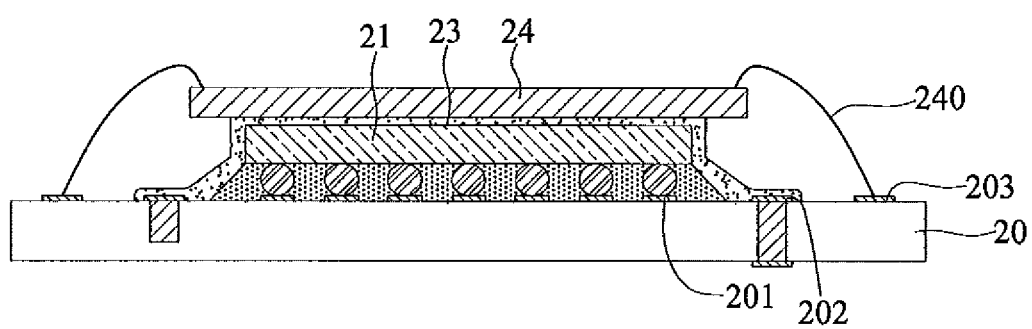
FIGS. 2D and 2E are schematic cross-sectional views showing a fabrication method of a semiconductor package of another embodiment according to the present invention.
Figure 2E:
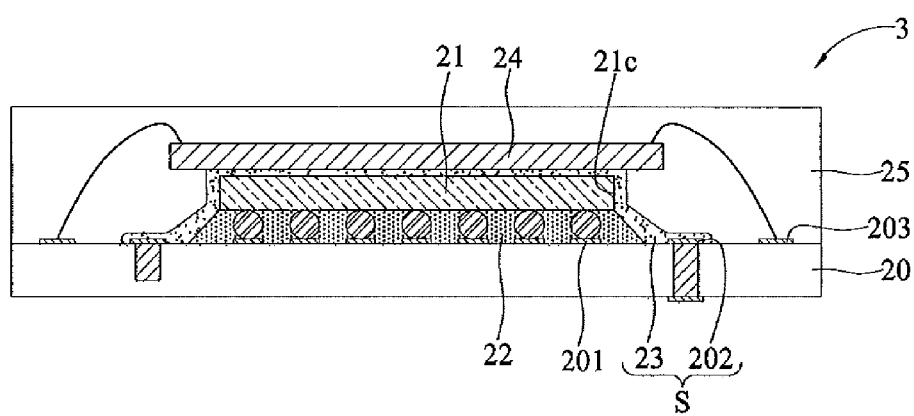

FIGS. 2D and 2E illustrate a fabrication method of a semiconductor package 3 of another embodiment according to the present invention. The description of same portion of the embodiments of FIGS. 2D and 2E and FIGS. 2A-2C are omitted.

Referring to FIG. 2D, the substrate 20 further has a plurality of third conductive pads 203, and the positions of the second conductive pads 202 do not affect the positions of the third conductive pads 203.

After the steps shown in FIGS. 2A-2C, an electronic element 24 is disposed on the conductive adhesive 23 and electrically connected to the third conductive pads 203 of the substrate 20 through a plurality of bonding wires 240.

In an embodiment, the electronic element 24 is a package or a chip.

Referring to FIG. 2E, a molding process is performed such that an encapsulant 25 is formed on the substrate 20 to encapsulate the electronic element 24, the bonding wires 240 and the conductive adhesive 23, to complete another semiconductor package 3.

According to the present invention, the conductive adhesive 23 is formed between the semiconductor element 21 and the electronic element 24 to serve as a shielding layer so as to prevent EMI from occurring between the semiconductor element 21 and the electronic element 24.

The present invention allows a plurality of electronic elements to be stacked in a single package to thereby save space on the substrate 20.

Further, since no opening is formed in the encapsulant 25, the present invention simplifies the design of a mold used in the molding process and allows a same mold to be applicable to the substrate 20, the electronic element 24 or chips of various sizes, thus reducing the fabrication cost.

In addition, the conductive adhesive 23 can be conveniently formed without the need to perform a sputtering process or fabricate a lid member as in the prior art, thus effectively reducing the fabrication cost.

The present invention further provides a semiconductor package 3, which has: a substrate 20; a semiconductor element 21 disposed on the substrate 20; an underfill 22 formed between the substrate 20 and the semiconductor element 21; a conductive adhesive 23 formed on the semiconductor element 21; an electronic element 24 formed on the conductive adhesive 23; and an encapsulant 25 formed on the substrate 20 to encapsulate the electronic element 24 and the conductive adhesive 23.

The substrate 20 has a plurality of first conductive pads 201, a plurality of second conductive pads 202, a plurality of third conductive pads 203, and a plurality of conductive vias 204 electrically connected to the second conductive pads 202. The second conductive pads 202 are ground pads and the conductive vias 204 are ground vias.

The semiconductor element 21 is disposed on the substrate 20 and electrically connected to the first conductive pads 201 of the substrate 20 through a plurality of conductive bumps 210.

The underfill 22 is formed between the semiconductor element 21 and the substrate 20 for encapsulating the conductive bumps 210.

The conductive adhesive 23 is formed on the semiconductor element 21 and extends to the second conductive pads 202 along side surfaces 22a of the underfill 22 such that the conductive adhesive 23 and the second conductive pads 202 form a shielding structure S.

The electronic element 24 is a package or a chip, which is disposed on the conductive adhesive 23 and electrically connected to the third conductive pads 203 of the substrate 20 through a plurality of bonding wires 240.

The encapsulant 25 is formed on the substrate 20 for encapsulating the electronic element 24, the bonding wires 240 and the conductive adhesive 23.

According to the present invention, the conductive adhesive and the second conductive pads form a shielding structure to thereby prevent electromagnetic interference from occurring between the semiconductor element and the electronic element.

Further, the conductive adhesive can be conveniently formed with a low cost.

Furthermore, since no opening is formed in the encapsulant, the present invention simplifies the design of a mold used in a molding process and allows a same mold to be applicable to substrates, electronic elements or chips of various sizes, thus resulting in a reduced fabrication cost.

The above-described descriptions of the detailed embodiments are only to illustrate the preferred implementation according to the present invention, and it is not to limit the scope of the present invention. Accordingly, all modifications and variations completed by those with ordinary skill in the art should fall within the scope of present invention defined by the appended claims.

What is claimed is:

1. A semiconductor package, comprising:
   a substrate having a plurality of first conductive pads and at least a second conductive pad;
   at least a semiconductor element disposed on the substrate and electrically connected to the first conductive pads;
   a conductive adhesive coated on and being in direct contact with a side surface of the semiconductor element and extending to the second conductive pad of the substrate so as to form a shielding structure together with the second conductive pad; and
   at least an electronic element disposed on the conductive adhesive.

2. The semiconductor package of claim 1, further comprising at least a conductive via formed in the substrate and electrically connected to the second conductive pad.

3. The semiconductor package of claim 2, wherein the conductive via is a ground via.

4. The semiconductor package of claim 1, wherein the second conductive pad is a ground pad.

5. The semiconductor package of claim 1, wherein the semiconductor element is electrically connected to the first conductive pads through a plurality of conductive bumps.

6. The semiconductor package of claim 5, further comprising an underfill formed between the semiconductor element and the substrate and encapsulating the conductive bumps.

7. The semiconductor package of claim 1, wherein the conductive adhesive extends to the second conductive pad along the side surface of the semiconductor element.

8. The semiconductor package of claim 1, wherein the substrate further has a plurality of third conductive pads electrically connected to the electronic element.

9. The semiconductor package of claim 1, wherein the electronic element is a package or a chip.

10. The semiconductor package of claim 1, further comprising an encapsulant formed on the substrate and encapsulating the semiconductor element, the electronic element and the conductive adhesive.

11. The semiconductor package of claim 1, further comprising an underfill formed between the semiconductor element and the substrate, wherein the conductive adhesive is formed on the underfill.

12. A fabrication method of a semiconductor package, comprising the steps of:
   providing a substrate having a plurality of first conductive pads and at least a second conductive pad;
   disposing at least a semiconductor element on the substrate and electrically connecting the semiconductor element and the first conductive pads;
   coating a conductive adhesive on the semiconductor element to cover the semiconductor element, the conductive adhesive being in direct contact with a side surface of the semiconductor element and extending to the second conductive pad of the substrate so as to form a shielding structure together with the second conductive pad; and
   disposing at least an electronic element on the conductive adhesive.

13. The fabrication method of claim 12, further comprising forming in the substrate at least a conductive via electrically connected to the second conductive pad.

14. The fabrication method of claim 13, wherein the conductive via is a ground via.

15. The fabrication method of claim 12, wherein the second conductive pad is a ground pad.

16. The fabrication method of claim 12, wherein the semiconductor element is electrically connected to the first conductive pads through a plurality of conductive bumps.

17. The fabrication method of claim 16, further comprising forming between the semiconductor element and the substrate an underfill encapsulating the conductive bumps.

18. The fabrication method of claim 12, wherein the conductive adhesive is formed by dispensing, screen printing, transfer printing or film lamination.

19. The fabrication method of claim 12, wherein the substrate further has a plurality of third conductive pads electrically connected to the electronic element.

20. The fabrication method of claim 12, wherein the electronic element is a package or a chip.

21. The fabrication method of claim 12, further comprising forming on the substrate an encapsulant encapsulating the semiconductor element, the electronic element and the conductive adhesive.

22. The fabrication method of claim 12, further comprising forming an underfill between the semiconductor element and the substrate, wherein the conductive adhesive is formed on the underfill.

* * * * *